United States Patent [19]

Klein

[11] Patent Number: 4,661,759
[45] Date of Patent: Apr. 28, 1987

[54] NICKEL-OXYGEN MONITOR CELL SYSTEM

[75] Inventor: Martin G. Klein, Brookfield, Conn.

[73] Assignee: Energy Research Corporation, Danbury, Conn.

[21] Appl. No.: 641,436

[22] Filed: Aug. 16, 1984

[51] Int. Cl.$^4$ .............................................. H02J 7/04
[52] U.S. Cl. ...................................... 320/48; 320/21; 320/45; 320/47
[58] Field of Search ....................... 320/21, 43, 44, 45, 320/46, 47, 48

[56] References Cited

U.S. PATENT DOCUMENTS 3,522,507  8/1970  Seiger .................................. 320/46
4,207,514  6/1980  Klein .................................... 320/44

FOREIGN PATENT DOCUMENTS 1163377  9/1969  United Kingdom .

Primary Examiner—Patrick R. Salce
Assistant Examiner—Anita M. Ault
Attorney, Agent, or Firm—John J. Torrente

[57] ABSTRACT

A system for monitoring the state of charge of a nickel-alkaline secondary battery wherein the monitor cell is comprised of a sealed metal-gas cell having a nickel electrode and an oxygen counter-electrode.

18 Claims, 5 Drawing Figures

NICKEL-OXYGEN MONITOR CELL SYSTEM

BACKGROUND OF THE INVENTION

This invention relates to systems and apparatus for monitoring the state of charge of rechargeable (secondary) batteries, and in particular, to metal-gas systems for monitoring the state of charge of nickel-alkaline secondary batteries.

U.S. Pat. No. 4,207,514, issued on June 10, 1980 and assigned to the same asignee hereof discloses a system for monitoring the state of charge of a secondary battery wherein a load charge sensor such as, for example, a shunt resistor, is placed in the current path connecting the secondary battery to a load or a charging supply. The load charge sensor provides signaling for a monitor cell load charge controller which, in turn, controls the magnitude and sense of the current being applied to a metal-gas monitor cell.

In particular, the sense of the current of the monitor cell (i.e., whether it is charging or discharging) is made the same as the sense of the current of the secondary battery, while the magnitude of the monitor cell current is made proportional to the magnitude of the battery current. Since the metal gas cell develops an internal pressure which is proportional to its charging and discharging transferred ampere hours, the resultant pressure in the cell will be indicative of the state of charge of the secondary battery. A state of charge transducer is responsive to the monitor cell pressure and provides a visual indication of the monitor cell pressure and, therefore, the secondary battery state of charge.

The '514 patent also disclosed that heightened reliability and correlation can be achieved when the respective characteristics of the monitor cell and the secondary battery are matched, for example, by employing the same type of solid electrode for each. Thus, for a nickel-alkaline secondary battery, the monitor cell should embody a nickel solid electrode. In this connection, the '514 patent specifically teaches the use of a nickel-oxide hydrogen monitor cell for nickel alkaline batteries, such as, for example, nickel-zinc.

While a nickel-hydrogen monitor cell develops a pressure which is indicative of nickel-alkaline battery state of charge, it has been found that over extended periods of time a gradual error arises between the pressure developed and the state of charge being monitored. It has been recognized by the present applicant that this error occurs because the nickel-hydrogen monitor cell exhibits a self-discharge mechanism which is not characteristic of the self-discharge mechanism in nickel-alkaline batteries. In particular, in the nickel hydrogen cell self-discharge arises as a result of the hydrogen in the cell reacting with the nickel electrode, This, in turn, causes an erroneous state of charge reading over time.

It is therefore an object of the present invention to provide a metal-gas system for monitoring the state of charge of nickel-alkaline batteries wherein the metal-gas system provides more accurate state of charging readings over extended periods of time.

SUMMARY OF THE INVENTION

In accordance with the principles of the present invention, the above and other objectives are realized in a metal-gas system wherein the metal gas monitor cell of the system includes a nickel electrode and an oxygen counter-electrode.

Such nickel-oxygen monitor cell has been found to exhibit a self-discharge mechanism which is like that of nickel alkaline secondary batteries. In particular, self-discharge of the nickel-oxygen monitor cell causes oxygen to be evolved in the cell and this is precisely the type of self-discharge loss exhibited by nickel-alkaline secondary batteries. As a result, self-discharge of the monitor cell does not create errors in its state of charge readings and the cell is found to successfully track secondary battery state of charge over extended periods of time.

In a further aspect of the invention, the nickel-oxygen monitor cell is further adapted to have extended life by utilizing two oxygen electrodes, one operative during discharge and the other during charging of the secondary battery. Switches are provided for switching the electrodes in and out of operation in dependence on whether a charge or a discharge condition is being monitored. The use of dual oxygen electrodes is found to avoid the materials and hysteresis problems encountered when bi-functional electrodes are utilized in the monitor cell, thereby providing the cell with an extremely long and stable life.

BRIEF DESCRIPTION OF THE DRAWINGS

The above and other features and aspects of the present invention will become more apparent upon reading the following detailed description in conjunction with the accompanying drawings, in which.

DESCRIPTION OF THE PREFERRED EMBODIMENTS

Figure 1:
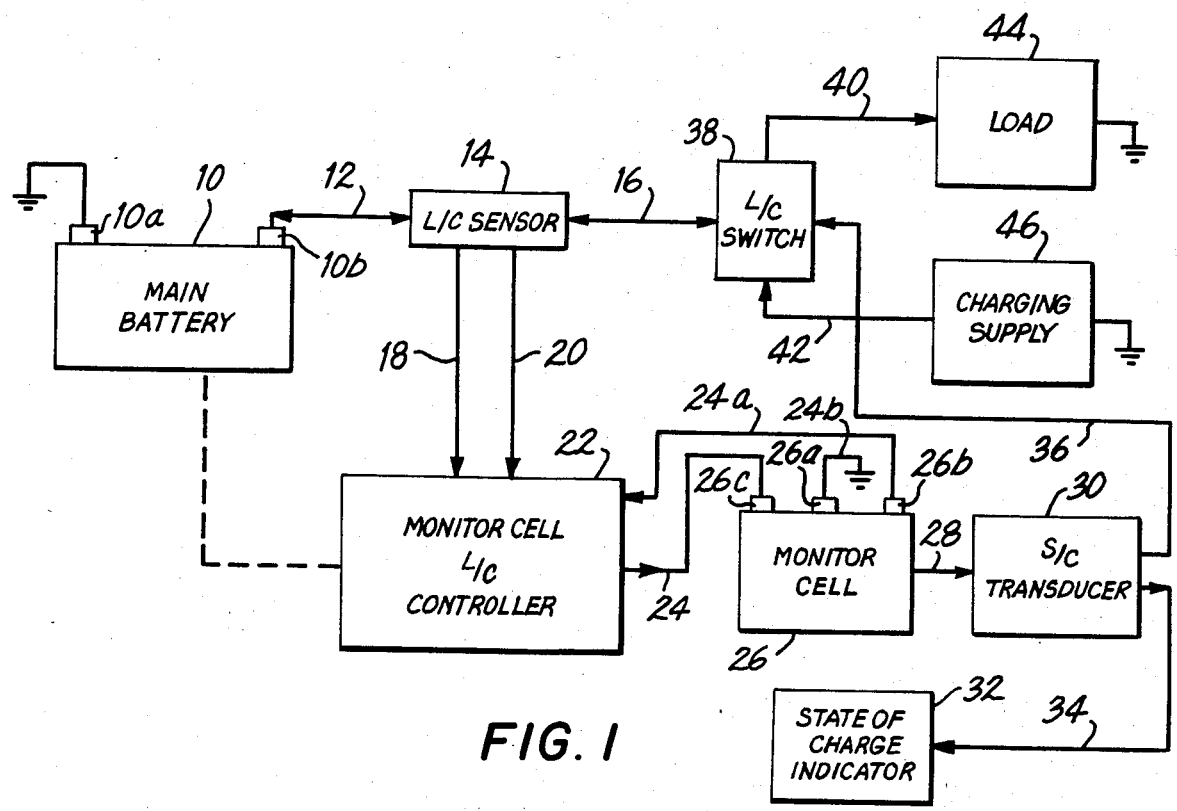
FIG. 1 shows a state of charge metal-gas monitoring system in accordance with the principles of the present.

Referring to FIG. 1, main battery 10 has an electrode 10a and an electrode 10b, the latter being connected to line 12. Battery 10 is a nickel-alkaline secondary battery such as, for example, a nickel-zinc or nickel-cadmium battery. L/C (load charge) sensor 14 is series-connected between line 12 and line 16 and output lines 18 and 20 extend therefrom. In a conventionally used arrangment for measuring instantaneous battery charging or discharging current, L/C sensor 14 is a series shunt resistor, with line 18 connected to the resistor terminal proximate line 12 and line 20 connected to the resistor terminal proximate line 16. Such resistor provides, through the amplitude and relative sense of voltage difference between lines 18 and 20, an indication of the sense of main battery terminal current (current flowing from/to electrode 10b to/from electrode 10a) and the magnitude thereof Lines 18 and 20 are conducted to monitor cell L/C controller 22, a suitable circuit embodiment of which is discussed below in connection with FIG. 4. Functionally, controller 22 supplies load current to line 24 (at this time current is drawn from line 24b) or draws charging current from line 24a (at this time current is supplied to line 24b) as a function of the sense of the voltage difference between lines 18 and 20, the magnitude of such loading/charging current being established by controller 22 in accordance with the amplitude of such line 18-line 20 voltage difference. Sensor 14 is preferably of character providing a change of differential voltage between lines 18 and 20 proportional to a change in main battery 10 terminal current and controller 22 is of character providing a change in line 24 or line 24a current proportional to the differential voltage between lines 18 and 20.

In accordance with the invention monitor cell 26 is a sealed metal-gas monitor cell having a nickel electrode 26a and an oxygen counter-electrode. In further accord with the invention, it is preferable that the cell 26 have two oxygen counter-electrodes, 26b and 26c, one of which 26c is connected in-circuit when loading current is being supplied to cell 26 and the other of which 26b is connected in-circuit when charging current is being drawn from cell 26. Selective interconnection of the oxygen electrodes in circuit is carried out by lines 24 and 24a which are themselves selectively opened and closed by controller 22. It should be noted that nickel electrode 26a corresponds to the positive terminal of a conventional battery, while oxygen electrodes 26b and 26c correspond to the negative terminal of such a battery.

Considering the nickel-oxygen metal-gas system, during cell charging, the nickel electrode is oxidized to nickel oxyhydroxide, while oxygen gas is consumed at the in-circuit oxygen electrode. During cell discharging, the reverse process occurs and the nickel electrode is reduced and oxygen gas is evolved at the in-circuit oxygen electrode. In each case, the quantity of gas consumed or evolved in the sealed cell is proportional to the number of ampere-hours transferred through the cell. Gas pressure within the cell housing thus increases and decreases proportionally to the respective charging and discharging transferred ampere-hours, thereby providing a desired measure of cell state of charge.

A pressure line 28 extends from cell 26 to S/C (state of charge) transducer 30. Transducer 30 may comprise a conventional pressure transducer or guage and it provides a visual or other sensible output reading in indicator 32 through line 34.

The output of transducer 30 may also be conducted over line 36 to L/C (load/charge) switch 38 whereby the switch may interconnect line 16 with either line 40 or line 42, depending upon whether main battery 10 is to be subjected to load 44 or charged by charging supply 46.

In operation of the FIG. 1 system, as main battery 10 is discharged from a charged condition, main battery terminal current flows through sensor 14 and through switch 38 to load 44. On the basis of the voltage differential between lines 18 and 20, controller 22 opens line 24a and closes line 24. Electrode 26c is thereby connected in-circuit and discharge current flows in line 24. Controller 22 accordingly loads cell 26 proportionally to the loading of main battery 10. Cell 26 is thereby discharged causing evolution of oxygen gas and increased pressure in the cell proportional to the loading of the cell and, therefore, to the loading of the main battery 10. State of charge indicator 32, thus provides an output indication corresponding to the discharging state of the main battery 10.

In the present illustrative case, when a predetermined low pressure output is reached on line 28, transducer 30 operates switch 38 to discontinue main battery discharge, i.e., by disconnecting lines 16 and 40 and connecting lines 16 and 42. The system of FIG. 1, however, may operate alternatively in a manual mode wherein switch 38 is manually shifted on the basis of indication provided by state of charge indicator 32.

With the switch 38 operated to cause recharging of main battery 10, the foregoing procedure reverses itself under the influence of sensor 14 and controller 22. Thus, the sense of the voltage difference between lines 18 and 20 reverses from that existing during discharging and controller 22 is responsive to such sense change to discontinue loading and begin charging of monitor cell 26. In this case, the controller causes line 24 to open and line 24a to close so that oxygen electrode 26b is now connected in-circuit. Charging current, preferably from a separate current supply, is now conducted such that monitor cell charging current on line 24a is exclusive of and proportional to charging current flowing from supply 46 to main battery 10.

In this case, the cell 26 is now charged causing oxygen gas to be consumed in the cell and, thereby, the cell pressure to decrease in proportion to the charging of cell 26 and therefore, the main battery 10. State of charge indicator 32 accordingly now tracks the charging condition of the main battery. As indicated by the broken line in FIG. 1 extending between battery 10 and controller 22, controller power may be derived from the main battery.

As mentioned previously, it has been found that the use of the nickel-oxygen couple for the sealed monitor cell 26 results in more reliable tracking of the state of charge of the nickel-alkaline and main battery 10 than heretofore achievable with previously contemplated couples. Thus, the nickel-oxygen couple, while not considered useful as a conventional battery couple for energy storage, has been found useful in the present monitor cell application, since it has been recognized that the discharge (including self-discharge) and charging mechanisms of the couple closely track those of the nickel-alkaline battery. Thus, unlike the previously contemplated nickel-hydrogen monitor cell whose self-discharge mechanism deviates with time from that of the nickel-alkaline battery, the present monitor cell is found to provide accurate state of charge readings over extended periods of time.

Furthermore, the use of different oxygen counter-electrodes for the discharging and charging periods of the nickel-oxygen cell 26 permit tailoring of the electrodes to optimize gas evolution and gas consumption during discharging and charging, respectively. The decay and hysteresis problems attendant the use in the cell of more conventional bi-functional oxygen electrodes are thus avoided and the likelihood of a long, stable life for the cell is significantly increased.

In this connection, it is noted that others have proposed the use of two oxygen electrodes for battery applications. However, these proposals have been dismissed as impractical due to the complicated switching circuits and additional electrodes needed. It has been recognized in the present application that the small size of the monitor cell substantially eliminates these potential drawbacks, thereby making the two oxygen electrode structure a practical candidate for the present monitor cell.

Figure 2:
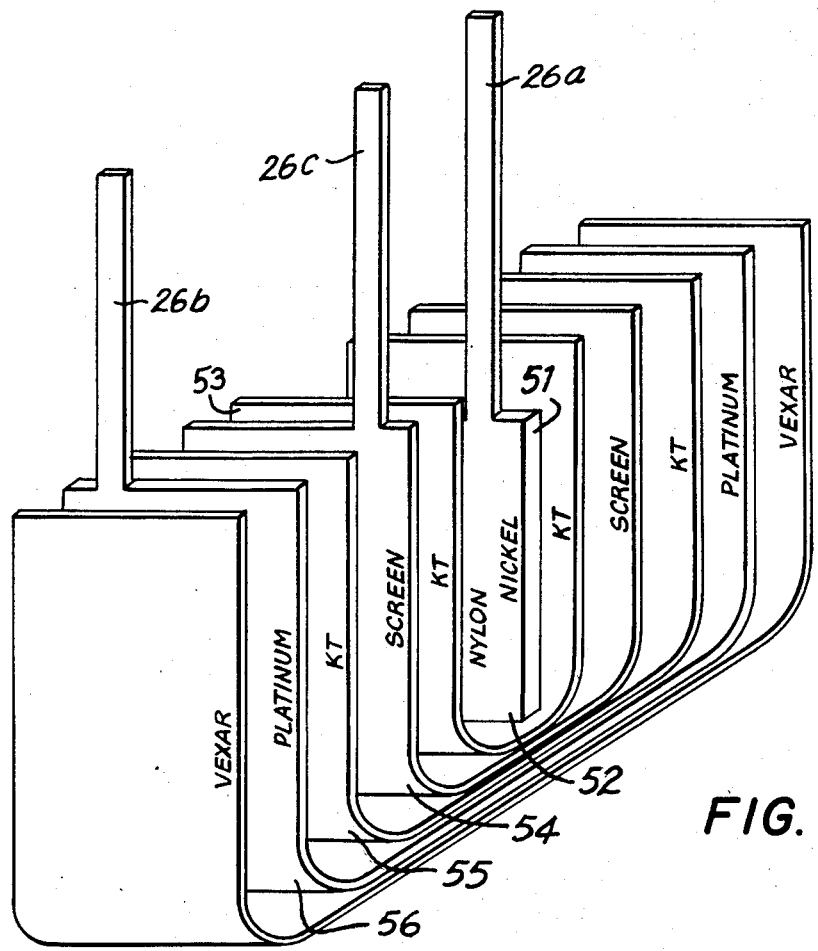
FIG. 2 shows the electrode configuration of the nickel-oxygen metal gas monitor cell of FIG. 1.

FIG. 2 shows an electrode configuration which is useable as the inner electrode configuration of the monitor cell 26. As shown, nickel electrode 51, having electrode terminal 26a, is surrounded by a number of U- shaped electrode, electrolyte and separator components. Proceeding from the components closest the nickel electrode 51, the layered structure is comprised as follows: a nylon layer 52 which serves as a separator, a potassium titanate (KT) layer or composite 53 which serves as an electrolyte absorber and as a separator; a first oxygen counter-electrode in the form of an expanded nickel screen 54 having a terminal 26c which functions as the optimized counter-electrode for oxygen evolution; a second KT layer 55 which also serves as an electrolyte absorber and as a separator; a second oxygen counter-electrode in the form of a platinum sheet 56 having the terminal 26b which functions as the optimized electrode for oxygen consumption; and a final separator layer comprised of an open mesh plastic sold under the name vexar. As above-noted, with this configuration the oxygen counter-electrodes 54 and 56 provide the desired optimum operating characteristics for the cell.

Figure 3:
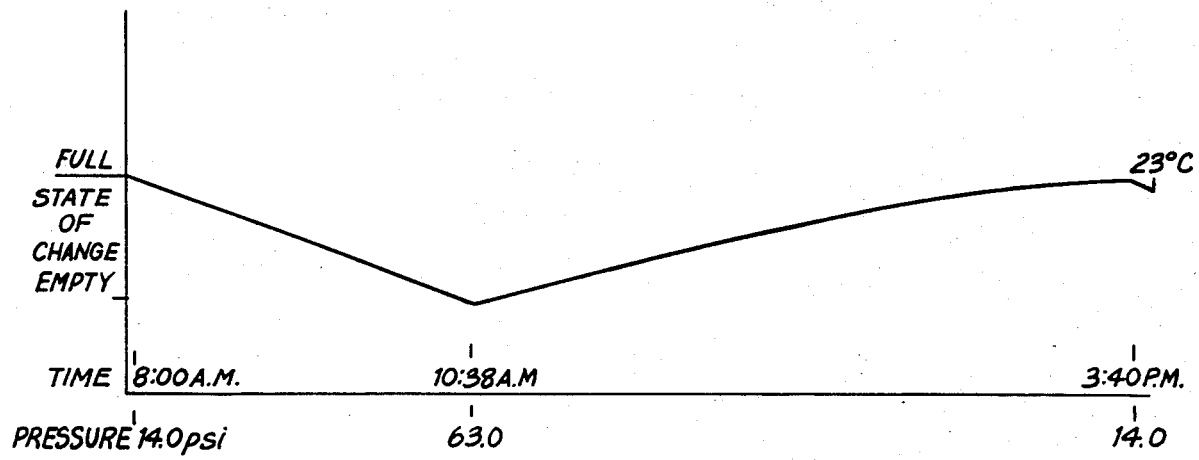
FIG. 3 shows a typical output display of the indicator of the system of FIG. 1.

FIG. 3 illustrates a typical state of charge indicator profile resulting from the discharge and charge of a nickel-cadmium alkaline battery as the main battery 10. In this case, the indicator 32 has transposed the actual pressure readings so that high pressure readings appear as a low output indication and low pressure readings as a high output indication. As can be appreciated, with this transposition, the output indication exhibits a linearly decreasing characteristic during the discharge period of the cell, while it exhibits a non-linearly sloping increasing characteristic which eventually levels off during the charge period of the cell. The composite characteristic can be shown to substantially replicate the state of charge characteristic of the nickel-cadmium battery.

Figure 4:
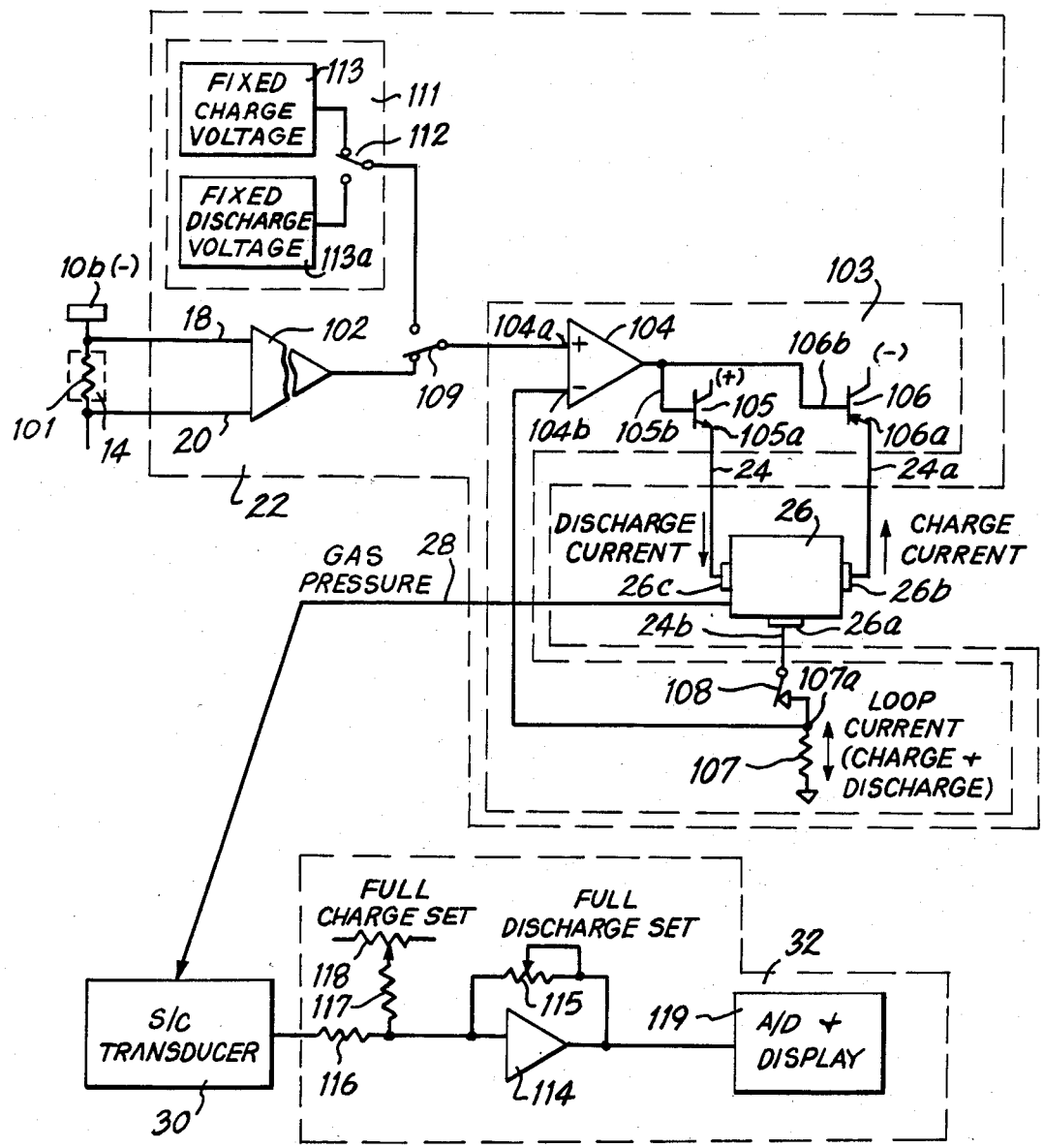
FIG. 4 shows schematically an embodiment of the monitor cell controller of FIG. 1 and its related components.

FIG. 4 shows the controller 22 of FIG. 1 and its related components in more detail. As shown, the L/C sensor 14 comprises a shunt resistor 101 which is in series with the terminal 10b of the main battery 10. In the present illustrative case, the terminal 10b is the negative terminal of the battery 10.

The shunt resistor 101 develops a low level (millivolt) signal which, as above-described, is applied across the lines 18 and 20 and whose sense is indicative of the sense of the current in the main battery 10 and whose magnitude is proportional thereto. The lines 18 and 20 couple this signal to an isolation amplifier 102 at the input end of L/C controller 22.

The amplifier 102 filters and amplifies the signal across lines 18 and 20 so that it develops an output voltage signal which is directly proportional to the battery 10 current signal and so that it is also at a level to cause a desired amount of current to be passed through the monitor cell 26. The voltage output of amplifier 102 is coupled to a precision bipolar current control circuit 103 comprising amplifier 104, npn transistors 105, pnp transistor 106 and resistor 107.

More particularly, the output of amplifier 102 is fed to the positive input port 104a of the amplifier 104. The amplifier 104 output is then coupled to the base paths 105b and 106b of transistors 105 and 106. The current emitter paths 105a and 106a of the transistors 105 and 106, in turn, are situated in the lines 24 and 24a connecting the controller 22 to the terminals 26c and 26b of the monitor cell 26. The terminal 26a of the cell 26 is connected to the terminal 107a of the resistor 107.

As can be appreciated, the current control circuit 103 acts as a high gain servo and produces a current flow through either the emitter path 105a or 106a which is directly proportional to the voltage input at amplifier port 104a (i.e., to the voltage output of amplifier 102) and, therefore, to the battery 10 current. The input to amplifier port 104a thus operates as a servo command signal, while a servo follow-up signal is provided by a feedback signal to the amplifier negative port 104b. This feedback signal is derived from the voltage across the resistor 107 and is therefore proportional to the current in the conducting emitter path.

In operation, during discharge of the main battery 10, the polarity of the voltage across load 101 (i.e., across lines 18 and 20) results in a servo command signal (i.e., an input signal to amplifier port 104a) which causes the amplifier 104 output signal to be of a polarity which turns on transistor 105 and turns off transistor 106. Current path 24a thereby opens and current path 24 thereby closes placing monitor cell terminals 26c and 26b in-circuit and out-of-circuit respectively. Discharge current proportional to the discharge current drawn from main battery 10 is thereby drawn from monitor cell 26.

When the main battery 10 is charged, on the other hand, the voltage polarity of the servo command signal reverses causing reversal of the amplifier 104 output. This causes transistor 106 to turn on and transistor 105 to turn off. Current path 24 thereby opens taking monitor cell terminal 26c out-of-circuit. Current path 24a, in turn, closes bringing terminal 26b in-circuit. Charging current proportional to the main battery 10 charging current thus charges monitor cell 26.

It should be noted that, in the case illustrated, the amplifier 102 has the form of an isolation amplifier. As a result, the signal applied to the amplifier need not be referenced to the "ground" of the monitor cell 26. The resistor 101 may thus be at a relatively high voltage relative to the monitor cell ground level. This is particularly advantageous where the main battery 10 is a propulsion battery for a vehicle, since it allows the monitor cell ground to be at the potential of the vehicle frame and since it allows the main battery to be isolated from the vehicle frame and the shunt sensor to be at a relatively high voltage relative to the frame.

As shown, the current control circuit 103 also includes a switch 108 which is situated in the path between monitor cell terminal 26a and resistor terminal 107a. The switch 108 prevents leakage current from changing the state of charge of monitor cell 26 when the cell is not in operation. This is accomplished by holding the switch open during this condition of the cell.

As is also shown, the controller 22 is provided with a further switch 109 situated between the amplifiers 102 and 104. Switch 109 allows the amplifier positive input port 104a to be switched from the amplifier 102 output to the output of a calibration circuit 111. Circuit 111 applies, via a further switch 112, fixed voltages 113 and 113a of opposite polarity (i.e. charge and discharge voltages) to the amplifier 104. This enables the current control circuit 103 and the monitor cell 26 to be initially calibrated with the state of charge of the main battery 10 for both charge and discharge conditions.

FIG. 4 also shows the state of charge indicator 32 in greater detail. As discussed above, gas pressure line 28 connects cell 26 to S/C transducer 30 and the transducer develops an output voltage which varies linearly according to the cell pressure. This output voltage is applied through resistor 116 to amplifier 114 of indicator 32. A resistor 117 is connected between the amplifier input and a variable resistor 118, while a variable resistor 115 connects the amplifier input and output. The latter output, in turn, is connected to a combined analog-to-digital converter and display 119.

Figure 5:
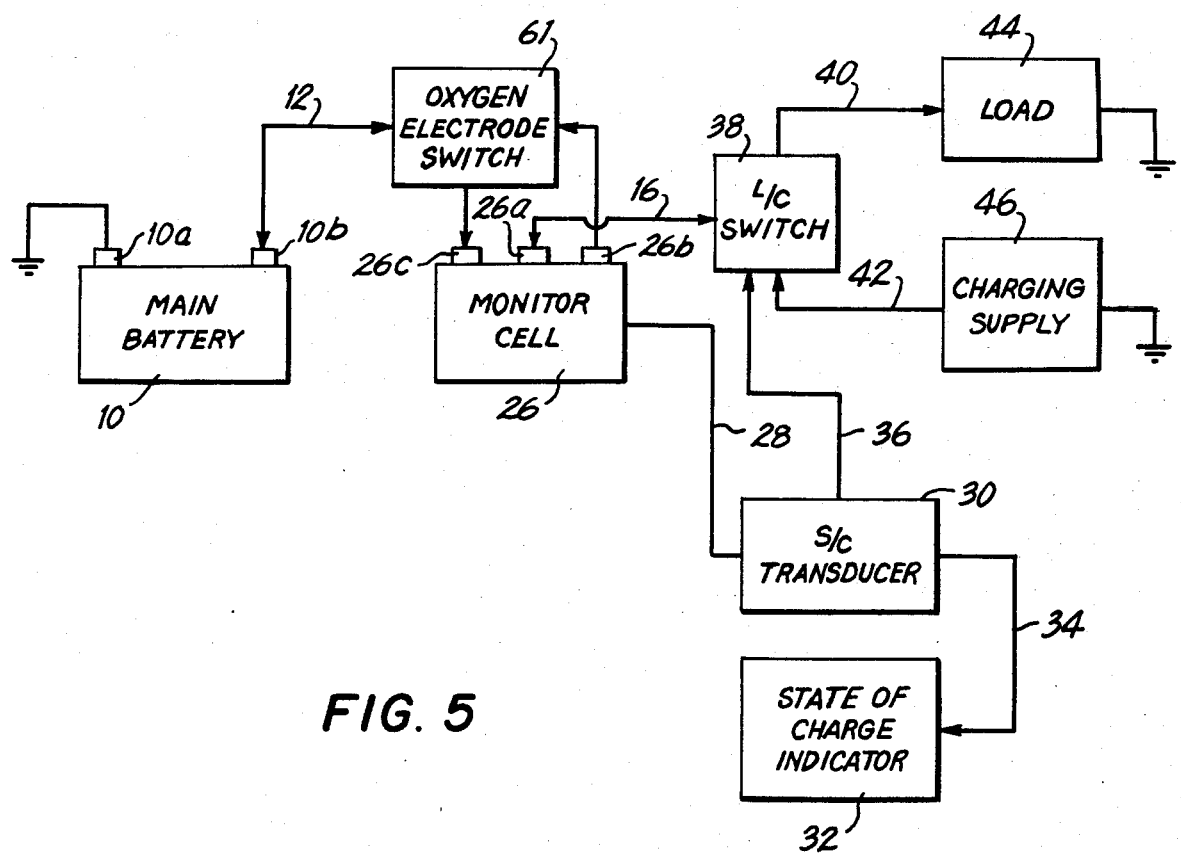
FIG. 5 shows a further embodiment of a metal-gas monitoring system in accordance with the princples of the present invention.

The variable resistors 115 and 118, respectively, allow the output of amplifier 114 to be adjusted so that at full discharge (highest pressure) the amplifier is at its lowest voltage and at full charge (lowest pressure) it is at its highest voltage. This results in a voltage output which is a transposition of the pressure output. The adjustments to resistors 115 and 118 are further made such that the voltage variation in the amplifier output is substantially one volt from full charge to full discharge It should be noted that the embodiment of the invention shown in FIG. 1 is most preferably used in situations where the main battery 10 is of reasonably high capacity (above about 5 ampere hours). In such cases, system factors, such as cost, complexity, weight and volume favor the use of a monitor cell whose capacity is lower than that of the main battery. Thus, for a 200 ampere-hour main battery, a 0.4 (1/500 times 200) ampere-hour monitor cell might typically be used. The lower ampere-hour monitor cell, in turn, requires the use of the sensor/controller circuitry of FIG. 1.

Where the main, battery 10 is of low capacity (below about 5 ampere hours), however, the system factors mentioned above favor, the use of a monitor cell whose capacity is substantially equal to that of the main battery, making the use of the sensor/controller circuitry unnecessary. FIG. 5 shows the system of FIG. 1 modified to handle low capacity main batteries. As can be seen, for this situation, the monitor cell 26 has been placed in series with the main battery 10 and the sensor 14 and controller 22 have been eliminated. More specifically, the main battery 10 has its electrode 10a grounded and its positive (nickel) electrode 10b connected via line 12 through electrode switch 61 to one or the other of the oxygen electrodes 26b and 26c of the nickel-oxygen metalgas cell 26. The nickel electrode 26a of this cell is, in turn, connected via line 16 to L/C switch 38. Switch 38 connects the line 16 either to a load 44 via line 40 or to a charging supply 46 via line 42 to thereby discharge or charge the main battery 10.

Pressure line 28 extends from the cell 26 to S/C transducer 30. Transducer 30 provides a visual or sensible output reading in indicator 32 through line 34. The output transducer 30 is also coupled over line 36 to L/C switch 38 which responds thereto by connecting line 16 with either line 40 or 42 depending upon whether battery 10 is to be connected to load 44 or charging supply 46.

The operation of the emobdiment of FIG. 5 is similar to that of FIG. 1. During loading or discharging of the main battery 10, the electrode switch 61 connects the monitor cell 26 in series with the main battery 10 via coupling of line 12 to oxygen electrode 26c. The same discharge current therefore flows through both the battery and monitor cell.

This discharge current causes oxygen gas to evolve in the cell and thereby increase the cell pressure proportionally to the magnitude of the discharge current. State of charge indicator 32 thereby provides an indication corresponding to the loading of the battery 10.

During charging of the battery 10, the circuit 61 again connects the monitor cell 26 in series with the battery, this time, however, via connection of line 12 to oxygen electrode 26b. The same charging current thus flows through the battery and cell. As a result, the cell consumes oxygen and experiences a decrease in pressure which is proportional to the charging current. Indicator 32, thereby now provides an indication of the charging of main battery 10.

In the embodiment of FIG. 5, it is preferable that the monitor cell 26 including its active nickel electrode be sized relative to the main battery 10, including its active nickel electrode so that the cell and battery are of the same ampere hour capacity. This will insure accurate tracking of the battery by the cell and will typically necessitate making the nickel electrodes of the battery and cell of equal size.

In all cases, it is understood that the above-identified arrangements are merely illustrative of the many possible specific embodiments which represent applications of the present invention. Numerous and varied other arrangements can readily be devised in accordance with the principles of the present invention without departing from the spirit and scope of the invention.

What is claimed is:

1. A system for use in monitoring the state of charge of a nickel-alkaline secondary battery, comprising:
   (a) sensor means for providing an output signal indicative of the magnitude and sense of terminal current of said monitored battery;
   (b) a sealed metal-gas monitor cell, said monitor cell including: a positive electrode comprising a nickel electrode; and a negative electrode comprising a first oxygen counter-electrode;
   (c) and circuit means responsive to said sensor means output signal for conforming the sense of terminal current of said monitor cell to the sense of such-monitored battery terminal current and for proportionally conforming the magnitude of such monitor cell terminal current to the magnitude of said monitored battery terminal current during both charging and loading of said monitored battery; whereby the gas pressure in said monitor cell is nade indicative of the state of charge of said monitored battery.

2. A system in accordance with claim 1 further comprising:
   means for providng a sensible output indication of said gas pressure in said cell.

3. A system in accordance with claim 1 further comprising:
   switch means responsive to said gas pressure in said cell for selectively connecting said monitored battery with a load or a charging supply.

4. A system in accordance with claim 1 wherein:
   said negative electrode of said monitor cell further comprises a second oxygen counter-electrode, said first oxygen counter-electrode being adapted to provide optimization of consumption of oxygen gas in said monitor cell and to operate in said monitor cell during passage of terminal current of one sense in said monitored battery, and said second oxygen counter-electrode being adapted to provide optimization of evolution of oxygen gas in said monitor cell and to operate in said cell during passage of terminal current of the other sense in said monitored battery;
   and said circuit means further includes means for switching said first oxygen electrode into the monitor cell circuit and said second oxygen electrode out of the nonitor cell circuit during passage of said one sense of terminal current in said monitored battery and for switching said second oxygen electrode into the monitor cell circuit and said first oxygen electrode out of the monitor cell circuit during passage of said other sense terminal current in said monitored battery.

5. A system in accordance with claim 4 wherein: said first electrode comprises platinum; and said second electrode comprises a screen.

6. A system in accordance with claim 4 further comprising:
switch means responsive to said gas pressure in said cell for selectively connecting said monitored battery with a load or a charging supply.

7. A system in accordance with claim 4 further comprising:
means for providing a sensible output indication of said gas pressure in said cell.

8. A system in accordance with claim 7 wherein: said sensor means is adapted to be in series with a terminal of said secondary battery.

9. A system in accordance with claim 8 wherein said circuit means comprises:
an isolation amplifier shunting said sensor:
a first amplifier having one input port coupled to the output of said isolation amplifier;
first and second transistors each having a base path coupled to the output of said first amplifier, said first transistor being an npn transistor and said second transistor being a pnp transistor, the emitter of said first transistor being connected to said first oxygen electrode and the emitter of said second transistor being connected to said second oxygen electrode;
a resistor having one end connected to both said nickel electrode and to a second port of said first amplifier.

10. A system in accordance with claim 9 wherein: said output indication means comprises:
a transducer responsive to the pressure of the gas in said monitor cell;
amplifier means coupled to said transducer for providing a voltage output which is high for low values of said gas pressure and which is low for high values of said gas pressure.

11. A system in accordance with claim 10 wherein: the amplifier means of said output indication means undergoes a voltage change of one volt in response to said monitored cell going from a full charge condition to a full discharge condition.

12. A system in accordance with claim 11 wherein: said sensor means is adapted to provide output signals of magnitude in the range of millivolts.

13. A system for use in monitoring the state of charge of a nickel alkaline secondary battery comprising:
(a) a sealed metal-gas monitor cell, said monitor cell including: a positive electrode comprising a nickel electrode, and a negative electrode comprising a first oxygen counter-electrode; and
(b) means for connecting said monitor cell electrically in series with said battery.

14. A system in accordance with claim 13 wherein: said monitor cell including said nickel electrode is such that said monitor cell is of the same ampere hour capacity as said battery.

15. A system in accordance with claim 13 further comprising:
means for providing a sensible output indication of said gas pressure in said cell.

16. A system in accordance with claim 13 wherein; said negative electrode of said monitor cell further comprises a second oxygen counter-electrode, said first oxygen counter-electrode being adapted to provide optimization of consumption of oxygen gas in said monitor cell and to operate in said cell during passage of terminal current of one sense in said battery, and said second oxygen counter-electrode being adapted to provide optimization of evolution of oxygen gas in said monitor cell and to operate in said cell during passage of terminal current of the other sense in said monitored battery; and said connecting means includes electrode switch means for switching said first oxygen electrode into the monitor cell circuit and said second oxygen electrode out of the monitor cell circuit during passage of said one sense of terminal current in said battery and for switching said second oxygen electrode into the monitor cell circuit and said first oxygen electrode out of the monitor cell circuit during passage of said other sense terminal current in said battery.

17. A system in accordance with claim 16 further comprising:
means for providing a sensible output indication of said gas pressure in said cell.

18. A system in accordance with claim 17 wherein said system further comprises:
further switch means for connecting said battery with a load or a charging supply, said further switch means being connected in series with said battery and monitor cell; and
a nickel alkaline secondary battery, said battery having first and second terminals one of which is connected to said electrode switch means.

* * * * *